United States Patent [19]

Hemmati

[11] Patent Number: 4,664,057
[45] Date of Patent: May 12, 1987

[54] PHOTOPROCESSING APPARATUS INCLUDING CONICAL REFLECTOR

[75] Inventor: Hamid Hemmati, Laurel, Md.

[73] Assignee: Allied Corporation, Morristown, N.J.

[21] Appl. No.: 811,792

[22] Filed: Dec. 20, 1985

[51] Int. Cl.⁴ ............................................. C23C 14/00
[52] U.S. Cl. ................................. 118/50.1; 118/620; 427/53.1
[58] Field of Search ............................. 427/54.1, 53.1; 250/493.1, 503.1, 504 R, 504 H, 505.1; 118/50.1, 620, 641

[56] References Cited

U.S. PATENT DOCUMENTS

| 2,741,691 | 4/1956 | Lee ....................................... 250/504 |
| 4,260,649 | 4/1981 | Denison ............................. 427/53.1 |
| 4,303,694 | 12/1981 | Bois . |
| 4,324,854 | 4/1982 | Beauchamp et al. . |
| 4,343,829 | 8/1982 | Tochikubo et al. . |
| 4,427,723 | 1/1984 | Swain . |
| 4,446,169 | 5/1984 | Castle et al. . |
| 4,581,248 | 4/1986 | Roche ................................ 118/641 |

FOREIGN PATENT DOCUMENTS 0194425 11/1984 Japan ................................. 118/620

Primary Examiner—John H. Newsome
Attorney, Agent, or Firm—Robert M. Trepp; Bruce L. Lamb

[57] ABSTRACT

A photoprocessing apparatus for processing substrates includes a chamber for holding the substrates and a light source for providing an electromagnetic beam along an axis. A substantially conical reflector is positioned along the axis of the electromagnetic beam to reflect the electromagnetic beam as a plane of light into the chamber. The substrates are arranged in the chamber with respect to the plane of light reflected by the substantially conical reflector, by being either substantially parallel to or substantially normal to the plane of light. If the substrates are substantially parallel to the plane of light and the chamber is filled with a reaction gas, photo-deposition will occur when the plane of light irradiates the reaction gas adjacent to a substrate, so that a film is deposited on the substrate. Other photoprocessing techniques such as photo-etching can be performed when the substrates are arranged normal to the plane of light.

18 Claims, 6 Drawing Figures

PHOTOPROCESSING APPARATUS INCLUDING CONICAL REFLECTOR

BACKGROUND OF THE INVENTION

1. Field of the Invention

This invention relates to a photoprocessing apparatus for the processing of semiconductors and thin films, and particularly to a photoprocessing apparatus which is useful for large-area batch processing of a large number of substrates.

2. Description of the Related Art

Recently there has been increased interest in the photoprocessing of semiconductors and thin films. The term photoprocessing includes photo-deposition, photo-etching, photo-lithography, etc. With the recent advances in laser and incoherent radiation processing (i.e., photoprocessing) of semiconductors, a need has arisen for an apparatus which is capable of large-area batch processing.

Photo-deposition techniques have attracted attention because of the increased degree of control which is made possible through the use of photo-deposition. Photo-deposition is the deposit of a material on a substrate as a result of a reaction between a molecule and electromagnetic radiation. For example, photo-deposition of a material on a wafer can be caused by placing a wafer in a chamber and pumping a reaction gas which includes the material to be deposited, into the chamber. Then, a light source is employed to excite the reaction gas, causing the gas molecule to be blown apart. That is, the desired material for deposit is dissociated from the gas molecule (photo-dissociation) and deposited on the wafer. Photo-deposition is a chemical process which requires that the wavelength and intensity (i.e., power) of the electromagnetic beam be selected so as to match with the gas molecule from which the desired material is to be deposited. The chemical reaction is activated by light, and the reaction may be aided by heating the chamber in which the substrate is placed, to a temperature of from room temperature to 1000° C. The use of photo-deposition techniques is particularly advantageous because a better quality film (from an impurity standpoint) can be obtained at a lower temperature than with other types of processing such as standard chemical vapor deposition, sputtering or liquid phase expitaxy. In addition, photo-deposition is particularly advantageous because temperatures in the range of 300° to 400° C. or lower can be employed, thereby making high quality deposition possible on those substrates which are damaged at higher temperatures (e.g., GaAs and InP).

In the past, lenses (particularly large telescopic lenses including a telescope with cylindrical lenses) or cassegranian beam expanders have been employed to expand the light source for photo-deposition. However, the large telescopic lenses become prohibitively expensive at ultraviolet wavelengths, and the cassegranian beam expanders create a donut shaped beam which is not particularly suitable for the photo-deposition process. In addition, both the lenses and the cassegranian beam expanders are capable of only low processing throughput.

One of the primary roadblocks to the commercial use of the photo-deposition process is the development of a technique for mass production of wafers using the photo-deposition process. Thus, there remains a need in the photoprocessing art for a technique for carrying out mass production of wafers using photoprocessing.

SUMMARY OF THE INVENTION

It is an object of the present invention to provide a photoprocessing apparatus which is capable of performing photoprocessing on a large batch of substrates.

It is a further object of the invention to provide a photoprocessing apparatus for photo-deposition on a substrate, by providing a reaction gas in a chamber holding the substrate, and by providing a plane of light adjacent to the substrate to irradiate the reaction gas adjacent the substrate, so that a film is deposited on the substrate.

The photoprocessing apparatus of the present invention includes means for holding at least one substrate and means for providing an electromagnetic beam along an axis. A reflecting means is positioned along the axis of the electromagnetic beam to reflect the electromagnetic beam as a plane of light. The at least one substrate is held by the holding means with respect to the plane of light reflected by the reflecting means, by being either substantially parallel to or substantially normal to the plane of light, so that photoprocessing can take place.

The preferred embodiment of the apparatus of the invention includes a chamber for holding at least one substrate and a light source for providing an electromagnetic beam along an axis. A substantially conical reflector is positioned along the axis of the light beam to reflect the light beam as a plane of light into the chamber, with the at least one substrate being arranged in the chamber, so that it is substantially parallel to the plane of light reflected by the substantially conical reflector. The apparatus also includes means for providing a reaction gas into the chamber, so that when the plane of light irradiates the reaction gas adjacent the at least one substrate, a film is deposited on the at least one substrate.

A variation of the preferred embodiment of the present invention includes the chamber for holding at least one substrate and the light source for providing an electromagnetic beam along an axis. The substantially conical reflector is positioned along the axis of the light beam for reflecting the light beam as a plane of light into the chamber. The at least one substrate is arranged so that it is substantially normal to the plane of light, and the substantially conical reflector is moved substantially continuously along the axis of the electromagnetic beam so as to scan the reflected light across the at least one substrate.

The photoprocessing apparatus of the present invention provides significant advantages over the prior art because it is capable of expanding a beam of light into a plane having an area which is greater than the substrate diameter, so that photoprocessing can be performed using a reflected plane of light. In addition, the use of the substantially conical reflector makes possible the batch processing of plural substrates, since the relative position of the substantially conical reflector along the axis of the electromagnetic beam can be varied to perform photoprocessing on a plurality of substrates. Further, the photoprocessing apparatus of the present invention is versatile, since by merely rearranging the relative position of the substrates in the chamber with respect to the reflected plane of light, the photoprocessing apparatus of the present invention can be used for photo-deposition, photo-etching, photo-lithography, etc.

These together with other objects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENT

Figure 1:
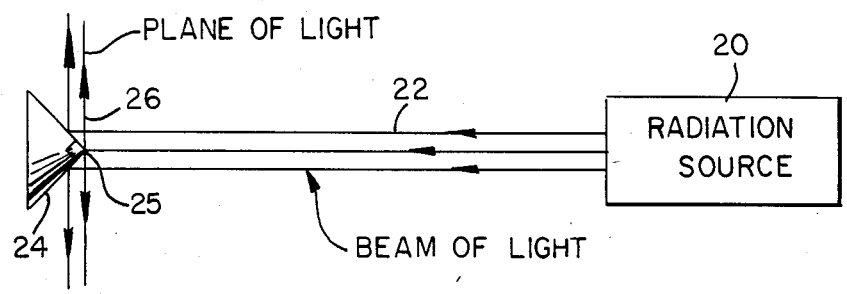
FIGS. 1 and 2 are schematic diagrams for describing the principle of operation of the photoprocessing apparatus of the present invention.

The principle of operation of the apparatus of the present invention will be described with respect to FIGS. 1 and 2. Referring to FIG. 1, a radiation source 20 emits a beam of light 22 which is reflected by a substantially conical reflector 24 so that a sheet of light is fanned out in a plane 26 which is normal to the axis of the incoming beam of light 22. The term beam of light is meant to cover all frequencies of the electromagnetic radiation spectrum, including but not limited to vacuum-ultraviolet light, ultraviolet light, visible light and infrared light. The radiation source or light source 20 may be either coherent (e.g., a laser) or incoherent (e.g., a lamp). If a laser is used, it may be continuous or pulsed mode with single-mode or multi-mode beam quality. In the preferred embodiment, the substantially conical reflector 24 has a 90° angle at the vertex 25 which is positioned along the axis of the electromagnetic beam 22. However, the angle of the vertex 25 of the conical reflector 24 may be varied from 10° to 170°, since the key to the photoprocessing relates to the relative position of the plane of light 26 with respect to the substrates to be processed. In particular, the conical reflector 24 must be such that the area of the plane of light adjacent to the substrate is coextensive with the area of the substrate itself. If the vertex 25 of the substantially conical reflector 24 has an angle of 90°, then the thickness of the plane of light 26 will be one-half the diameter of the electromagnetic beam 22. Thus, the thickness of the plane of light 26 may be controlled by controlling the beam diameter. The substantially conical reflector 24 may be made of any type of reflective coating, for example, polished aluminum, glass with an aluminum coating, dielectric coating, gold coating, etc. The important thing is that the substantially conical reflector 24 should reflect the wavelength of the electromagnetic beam 22. Aluminum is a good choice as a reflective coating because it reflects over a wide range of wavelengths.

Figure 2:
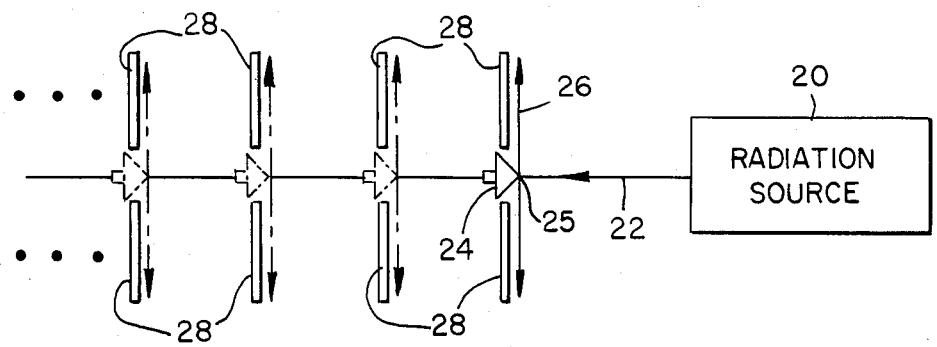

FIG. 2 is a schematic diagram illustrating how the apparatus of the present invention is used for photoprocessing of a plurality of substrates 28. Currently, most substrates are four inches in diameter; however, it is likely that substrates having diameters of six to eight inches will be used in the future. This will make the requirements for uniform deposition even more severe since the reaction caused by the electromagnetic beam must occur over the entire wafer. In this particular illustration, the substantially conical reflector 24 is positioned along the axis of the electromagnetic beam 22 so that the plane of light 26 is fanned out by the reflector 24. A plurality of substrates 28 are arranged substantially in parallel to each other and substantially in parallel to the plane of light 26. As illustrated in FIG. 2, the substantially conical reflector 24 is stepped to the various positions indicated in FIG. 2 (including the positions illustrated in phantom) along the axis of the electromagnetic beam 22, so as to perform photoprocessing on each of the substrates 28. In this particular illustration, the substrates are arranged so that photo-deposition can take place.

Figure 3:
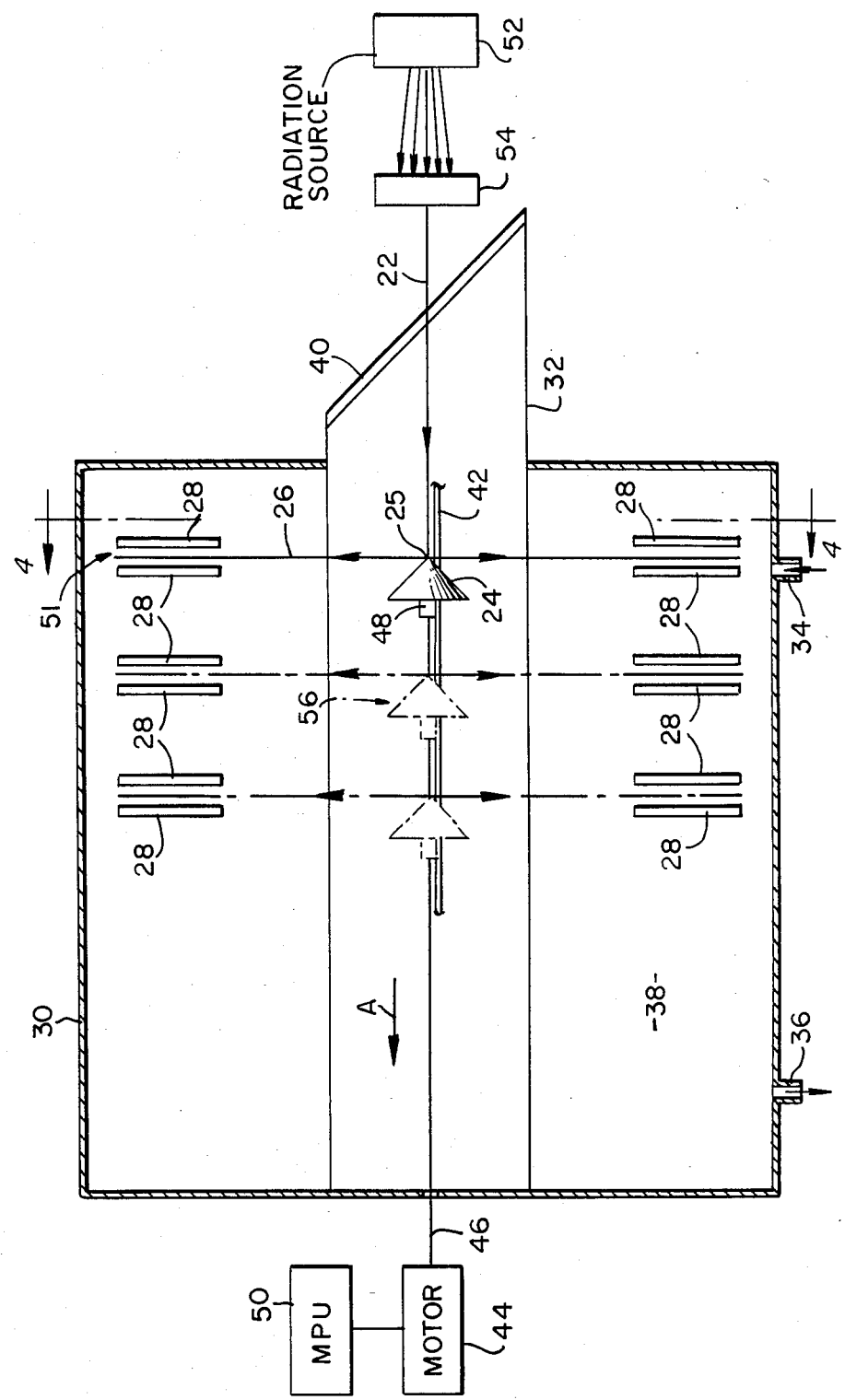
FIG. 3 is a side view partially in cross-section, of the photoprocessing apparatus of the present invention, with the substrates arranged so that photo-deposition can take place.

FIG. 3 is a side view, partially in cross-section, of the apparatus of the present invention, for performing processing on plural substrates 28 which are arranged for photo-deposition of a material thereon. In FIG. 3, a radiation source 52 (coherent or incoherent) is shown with a beam collimator 54 (e.g., a telescope or lens or lenses in the light path) for controlling the diameter of the electromagnetic beam 22. A cylindrical housing 30 is a reaction chamber for holding the substrates 28. The substrates are positioned within the cylindrical housing 30 using any appropriate racks or holders (not shown). The substantially conical reflector 24 is positioned within an inner cylindrical housing 32 which is wholly or partially formed of a material transparent to the wavelength of the electromagnetic beam 22. In the preferred embodiment, the inner cylindrical housing 32 and the cylindrical housing 30 are coaxial about the axis of the electromagnetic beam 22, although the particular shape of the housings 30 and 32 is unimportant, since the key to the present invention is the relative position of the plane of light 26 (reflected by the substantially conical reflector 24) with respect to the substrates 28. In the preferred embodiment, the reaction chamber 30 is made of glass, aluminum or stainless steel, so that it is vacuum compatible and non-reactive with the reaction gases to be used in the chamber. A gas inlet 34 and a gas outlet 36 are formed in the reaction chamber 30 so as to communicate reaction gases to and from the interior 38 of the reaction chamber 30. For example, the gas inlet 34 may be connected to a source of gas or gases, while the gas outlet 36 may be connected to a vacuum pump for creating a moderate to high vacuum (e.g., $10^{-3}$ torr to $10^{-11}$ torr). The inner walls of the reaction chamber 30 may be made reflective with respect to the particular wavelength of the electromagnetic beam 22 being used, so that excess radiation is reflected inwardly to create a more uniform light intensity across the substrates 28. Alternatively, the inner walls may be coated with an absorptive material.

In the preferred embodiment, the inner cylindrical housing 32 has an atmopshere which is isolated from the interior 38 of the reaction chamber 30. For example, the inner cylindrical housing 32 may contain an inert gas (e.g., He, Ne or $N_2$), to prevent absorption of the electromagnetic beam 22, and to prevent oxidation of the substantially conical reflector 24 under radiation exposure. While it is not necessary to enclose the substantially conical reflector 24 within the chamber 32, the provision of the enclosed chamber 32 keeps the surface of the substantially conical reflector 24 free from contaminants and prevents oxidation as described above. The inner cylindrical housing 32 is made of a material transparent to the wavelength of the electromagnetic beam 22, and is equipped with an input window 40 which is made of a material for effectively transmitting the wavelength of the electromagnetic beam 22 which is used. For example, if the electromagnetic beam 22 is ultraviolet light, a fused silica or quartz window 40 may be employed. If a $CO_2$ laser (infrared light) is used to generate the electromagnetic beam 22, a germanium or sodium chloride crystal (NaCl) window may be used. If the electromagnetic beam 22 is visible light, then glass may be used as the input window 40. The input window 40 may be tilted or at the Brewster angle to minimize surface reflection of the electromagnetic beam 22 and maximize transmission. However the input window 40 may also be positioned so that it is normal to the electromagnetic beam 22.

In the preferred embodiment, the electromagnetic beam 22 is a laser beam of a wavelength which dissociates the molecule (i.e., reaction gas) which is pumped into the reaction chamber 30. The wavelengths at which various elements dissociate from molecules are well known. One laser which has been used to dissociate a number of molecules is the Excimer (excited dimer) laser which has a short wavelength and a high peak power (up to 1 Joule). The materials which can be deposited include, for example, aluminum, refractory metals, III-V compounds, insulators and silicides.

The substantially conical reflector 24 may be supported and transported along the axis of the electromagnetic beam 22 by any suitable transporting means. For example, the substantially conical reflector 24 may be supported for movement along a rail 42 which may be transparent or made of any other suitable material. The substantially conical reflector 24 may be transported along the rail 42 by any suitable means, for example, a motor 44 and a wire 46 which is connected to a translation amount 48 extending from the substantially conical reflector 24. The motor may be actuated by manual controls or under the control of a microprocessor 50, so as to transport the substantially conical reflector 24 along the axis of the electromagnetic beam 22 in the direction of the arrow A in FIG. 3. It should be noted that the particular means for transporting the substantially conical reflector 24 is not limited to that illustrated in FIG. 3 but may be, for example, hydraulic or pneumatic drive systems, etc. When photo-deposition is to be performed, the motor 44 may be a stepper motor so as to be compatible with the intermittent transport (i.e., incremental stepping) of the substantially conical reflector 24, which is required for photo-deposition.

When the apparatus of FIG. 3 is to be used to perform a photo-deposition process, the substrates 28 are arranged as shown, so that they will be substantially parallel to the plane of light 26. A reaction gas (e.g., $Al(CH_3)_3$, $Ga(CH_3)_3$, $AsH_3$, or $SiH_4$) is pumped into the interior of the reaction chamber 30 via the gas inlet 34. The reaction chamber 30 is heated to a temperature of from room temperature to 1000° C. to aid the photo-deposition reaction. The particular temperature employed will vary with the type of substrate used (e.g., certain substrates dissociate at relatively low temperatures). This auxiliary heating may be performed by heating the entire reaction chamber 30 or by providing heaters (not shown) for the substrates 28 within the reaction chamber. The substrates 28 are preferably positioned at a sufficient distance from the axis of the apparatus so that a fairly uniform flux is provided across the portion of the plane of light 26 opposite the substrates 28. In this case, the inner cylindrical housing 32 has a diameter which is large enough to avoid excess radiation absorption in the interior 38 of the reaction chamber 30. The electromagnetic beam 22 is transmitted through the input window 40 and is reflected as a plane of light by the substantially conical reflector 24, so that the plane of light 26 is substantially parallel to and adjacent to (i.e., at a predetermined distance from) at least one of the substrates 28. By selecting the appropriate wavelength and intensity of the electromagnetic beam 22 for the particular material which is to be deposited, a reaction will occur as a result of the plane of light 26 irradiating the reaction gas, and the deposition material will be deposited on the substrate 28.

FIG. 3 illustrates an embodiment of the present invention in which the substantially conical reflector 24 is positioned so that the plane of light 26 will be reflected between a pair 51 of substrates 28, so that photo-deposition can simultaneously occur on each substrate in the pair 51 of adjacent substrates 28. Of course, multiple pairs of substrates may be positioned to encircle the reaction chamber 30, so that photo-deposition may take place on multiple substrates 28 (e.g., 8 substrates) at one time (i.e., while the substantially conical reflector 24 is stopped at one deposition position along the axis of the electromagnetic beam 22).

Figure 4:
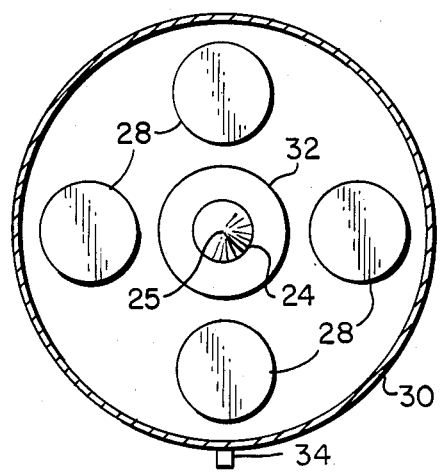
FIG. 4 is a cross-sectional view taken along the line 4—4 in FIG. 3.

FIG. 4 is a cross-sectional view taken along line 4—4 in FIG. 3 and showing that a plurality of pairs 51 of substrates 28 may be positioned about the axis of the light beam 22, for processing of multiple substrates 28 while the substantially conical reflector 24 is stopped at one deposition position along the axis of the electromagnetic beam 22. After the desired deposition of this group of substrates 28 has taken place, the substantially conical reflector 24 is transported along the axis of the electromagnetic beam 22 until the next photo-deposition position is reached (e.g., position 56 illustrated in phantom in FIG. 3), at which time photo-deposition is performed on the group of substrates 28 which is positioned closest to and in parallel to the plane of light 26. This process is repeated until deposition takes place on all of the substrates 28 in the reaction chamber 30. Thus, over one hundred substrates 28 may be treated during a single traversal of the substantially conical reflector 24 across the inner chamber 32.

Figure 5:
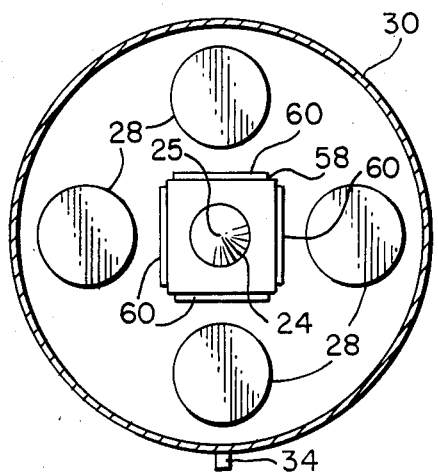
FIG. 5 is a cross-sectional view, similar to FIG. 4, of an alternate embodiment of an inner chamber for holding the substantially conical reflector.

FIG. 5 is a cross-sectional view, similar to FIG. 4, wherein the inner cylindrical housing 32 is replaced by a housing 58 having windows 60 therein. As illustrated by this variation of the embodiment of the invention, it is not necessary that the plane of light 26 be continuously reflected within the reaction chamber 30. Instead, it is only necessary that the plane of light 26 be reflected so that it is coextensive with and parallel to each of the substrates 28 for which photo-deposition is to be performed. Thus, as illustrated in FIG. 5, the housing 58 may be opaque, with windows 60 formed therein, so that the plane of light 26 is reflected only through the windows 60. In addition, the windows 60 may be replaced with lenses (e.g., highly transmittive lenses for further beam shaping) if desired.

Figure 6:
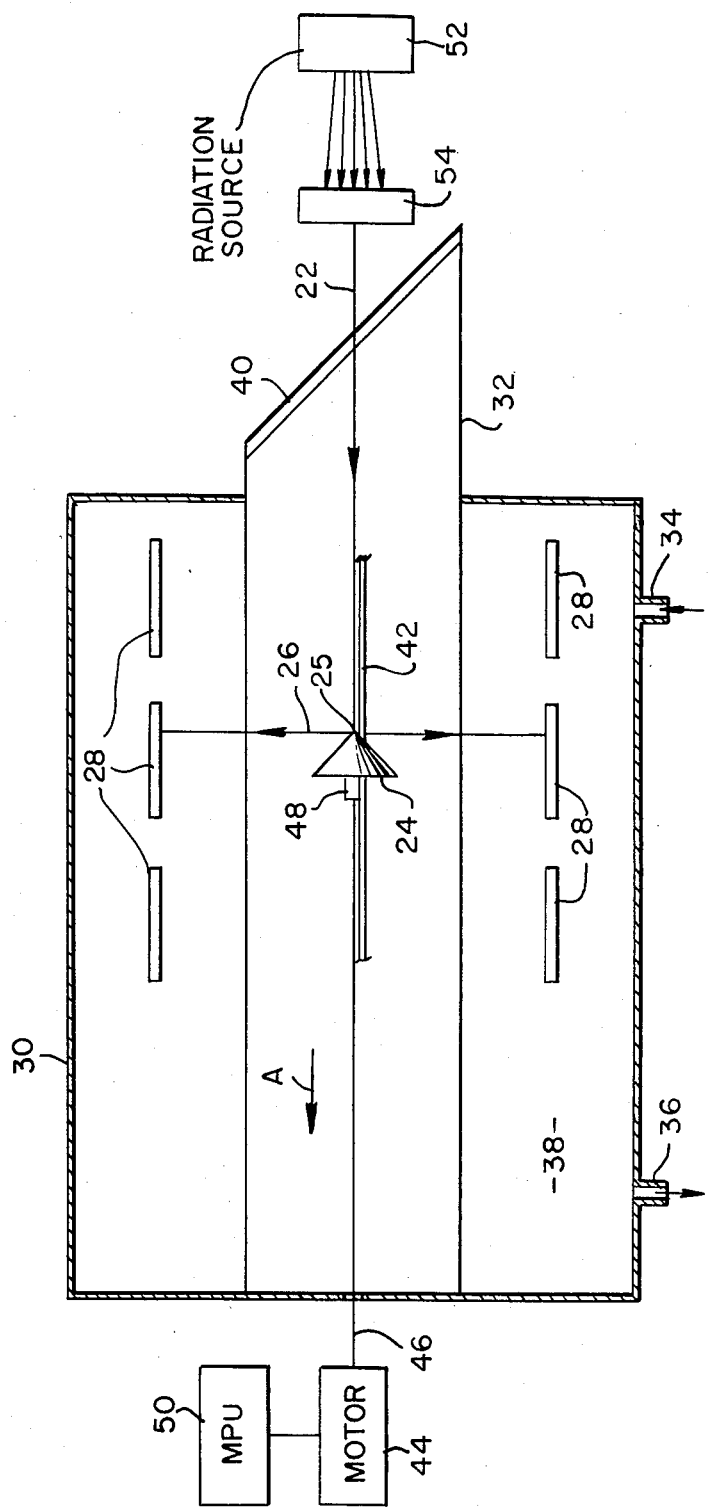
FIG. 6 is a side view, partially in cross-section, of the photoprocessing apparatus of the present invention, with the substrates arranged so that photoprocessing (e.g., photo-etching) can be performed.

FIG. 6 is a side view, partially in cross-section, of a variation of the embodiment of FIG. 3, wherein the substrates 28 are arranged for photoprocessing other than photo-deposition. For example, FIG. 6 illustrates an arrangement of substrates 28 with respect to the plane of light 26 which might be used for photo-etching, wherein the substrates 28 are arranged so that they are normal to the plane of light 26. For example, the substrates 28 may be coated and then placed in the reaction chamber 30 and masked. The substrates are then irradiated by the plane of light 26. After irradiation, an etching step is performed to remove predetermined portions of the coating. In this process, the substantially conical reflector 24 is moved continuously along the axis of the electromagnetic beam 22 so as to scan the substrates 28.

The photoprocessing apparatus of the present invention provides a number of advantages over prior art apparatus. The substantially conical reflector 24 provides a simple structure for reflecting a plane of light 26 for purposes of performing photo-deposition on a plurality of substrates 28. Thus, the apparatus of the invention lends itself to photo-deposition of a large batch of substrates at the same time, thereby making it possible to process a large number of substrates in a single batch. In addition, the apparatus of the present invention is versatile since it may be used for various types of photoprocessing, for example, photo-etching, as illustrated in FIG. 6.

The many features and advantages of the invention are apparent from the detailed specification and thus it is intended by the appended claims to cover all such features and advantages of the apparatus which fall within the true spirit and scope of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What is claimed is:

1. A photoprocessing apparatus for performing photoprocessing on at least one substrate, comprising:
   means for holding the at least one substrate;
   means for providing an electromagnetic beam along an axis; and
   a substantially conical reflector, positioned along the axis of the electromagnetic beam, for reflecting the electromagnetic beam as a plane of light, said holding means holding the at least one substrate so that it is arranged either substantially parallel to or substantially normal to the plane of light reflected by said reflecting means, so that photoprocessing can be performed.

2. A photoprocessing apparatus as set forth in claim 1, wherein said substantially conical reflector has a vertex with an angle of from 10° to 170°, said vertex being positioned along the axis of the electromagnetic beam.

3. A photoprocessing apparatus as set forth in claim 2 wherein said vertex of said substantially conical reflector has an angle of substantially 90°.

4. A photoprocessing apparatus as set forth in claim 1, wherein said holding means comprises a chamber for holding the at least one substrate, said chamber being positioned so that said substantially conical reflector reflects the plane of light into said chamber.

5. A photoprocessing apparatus as set forth in claim 4, wherein said means for providing an electromagnetic beam comprises a laser.

6. A photoprocessing apparatus for performing photoprocessing on at least one substrate, comprising:
   a chamber for holding the at least one substrate;
   a light source for providing an electromagnetic beam along an axis;
   a substantially conical reflector positioned along the axis of the light beam for reflecting the light beam as a plane of light into said chamber, the at least one substrate being arranged so that it is substantially parallel to the plane of light reflected by said substantially conical reflector; and
   means for providing a reaction gas into said chamber, so that when the plane of light irradiates the reaction gas adjacent to the at least one substrate, a film is deposited on the at least one substrate.

7. A photoprocessing apparatus as set forth in claim 6, wherein said substantially conical reflector has a vertex positioned along the axis of the electromagnetic beam, said vertex having an angle of from 10° to 170°.

8. A photoprocessing apparatus as set forth in claim 7, wherein said vertex of said substantially conical reflector has an angle of substantially 90°.

9. A photoprocessing apparatus as set forth in claim 6, wherein said chamber comprises an outer chamber for holding a plurality of substrates, said apparatus further comprising an inner chamber positioned within said outer chamber, said substantially conical reflector being disposed inside said inner chamber.

10. A photoprocessing apparatus as set forth in claim 7, further comprising means for transporting said substantially conical reflector along the axis, of the electromagnetic beam.

11. A photoprocessing apparatus as set forth in claim 10, wherein said transporting means comprises means for transporting said substantially conical reflector intermittently along the axis of the electromagnetic beam, so that the plane of light reflected by said substantially conical reflector is temporarily stopped adjacent a group of substrates.

12. A photoprocessing apparatus as set forth in claim 11, wherein the substrates are positioned in said outer chamber so that pairs of the substrates are arranged adjacent to each other, and wherein said transporting means comprises means for intermittently transporting said substantially conical reflector to temporarily stop the plane of light in between a pair of the substrates, so that a film is deposited on both substrates in the pair at the same time.

13. A photoprocessing apparatus as set forth in claim 12, wherein said light source comprises a laser.

14. A photoprocessing apparatus as set forth in claim 13, wherein said inner and outer chambers are cylindrical, wherein said outer chamber is concentric with said inner chamber, and wherein a plurality of substrates are arranged in said outer chamber surrounding said inner chamber.

15. A photoprocessing apparatus as set forth in claim 14, wherein said outer chamoer has an inner wall which reflects the electromagnetic beam.

16. A photoprocessing apparatus as set forth in claim 14, wherein said outer chamber has an inner wall which absorbs the electromagnetic beam.

17. A photoprocessing apparatus as set forth in claim 13, wherein said outer chamber is cylindrical and wherein said inner chamber comprises a substantially rectangular shaped housing having windows formed therein for transmitting the plane of light to said outer chamber.

18. A photoprocessing apparatus as set forth in claim 17, wherein said windows comprise highly transmissive lenses.

* * * * *